United States Patent
Zeng

(10) Patent No.: US 10,340,853 B1
(45) Date of Patent: Jul. 2, 2019

(54) RADIO FREQUENCY RECEIVING CIRCUIT AND RADIO FREQUENCY RECEIVER

(71) Applicant: SHENZHEN JOINTWAY IC DESIGN CO., LTD., Shenzhen, Guangdong (CN)

(72) Inventor: Longyue Zeng, Shenzhen, Guangdong (CN)

(73) Assignee: SHENZHEN JOINTWAY IC DESIGN CO., LTD., Shenzhen (CN)

(*) Notice: Subject to any disclaimer, the term of this patent is extended or adjusted under 35 U.S.C. 154(b) by 0 days.

(21) Appl. No.: 16/154,720

(22) Filed: Oct. 9, 2018

(30) Foreign Application Priority Data

Jul. 17, 2018 (CN) .......................... 2018 1 0785205

(51) Int. Cl.
| | |
|---|---|
| H04B 1/06 | (2006.01) |
| H03F 1/02 | (2006.01) |
| H03F 3/193 | (2006.01) |
| H04B 1/16 | (2006.01) |
| H03F 3/45 | (2006.01) |

(52) U.S. Cl.
CPC .......... *H03F 1/0205* (2013.01); *H03F 3/193* (2013.01); *H03F 3/45192* (2013.01); *H04B 1/16* (2013.01); *H03F 2200/451* (2013.01); *H03F 2203/45444* (2013.01)

(58) Field of Classification Search
CPC ............. H03F 3/45475; H03F 3/45183; H03F 2200/129; H03F 3/45273; H03F 1/0205; H03F 1/083; H03F 2200/135; H03F 2200/156; H03F 2200/159; H03F 2200/264; H03F 2200/288; H03F 2200/303; H03F 2200/375; H03F 2200/451; H03F 2200/513; H03F 2203/45051; H03F 2203/45101; H03F 2203/45114; H03F 2203/45116
USPC ........................................................ 455/232.1
See application file for complete search history.

(56) References Cited

U.S. PATENT DOCUMENTS

| | | | |
|---|---|---|---|
| 5,805,089 A * | 9/1998 | Fiedler | H03M 9/00 341/101 |
| 5,955,978 A * | 9/1999 | Fiedler | H03M 1/1023 341/118 |
| 6,774,721 B1 * | 8/2004 | Popescu | H03K 5/003 326/115 |

* cited by examiner

*Primary Examiner* — Ajibola A Akinyemi

(57) ABSTRACT

A radio frequency receiving circuit, including: a tail current source, configure to be multiplexed to input radio frequency signals and amplify the radio frequency signals for producing a radio frequency current; a clock signal input unit, in connection with the tail current source and configured to input clock signals; a sampling-and-holding unit, in connection with the clock signal input unit and configured to output an orthogonal signal having a frequency of one half of a clock frequency; and a load unit, in connection with the sampling-and-holding unit. The radio frequency current flowing through the load unit is converted into a voltage which is modulated by the orthogonal signal, and a medium frequency signal having a frequency equivalent to a difference between a radio frequency signal frequency and an orthogonal signal frequency is output, whereby achieving the frequency mixing.

9 Claims, 2 Drawing Sheets

RADIO FREQUENCY RECEIVING CIRCUIT AND RADIO FREQUENCY RECEIVER

CROSS-REFERENCE TO RELATED APPLICATIONS

Pursuant to 35 U.S.C. § 119 and the Paris Convention Treaty, this application claims the benefit of Chinese Patent Application No. 201810785205.3 filed on Jul. 17, 2018. The content of the aforementioned application, including any intervening amendments thereto, is incorporated herein by reference.

TECHNICAL FIELD

The present application relates to the technical field of telecommunication, more particularly to a radio frequency receiving circuit and a radio frequency receiver.

BACKGROUND

With the rapid development of the modern communication system, the communication industry has become an industry having a wide range of market audiences, and the application of the communication system has penetrated into every corner of society. The RF receiver has also been widely used as a basic module in the communication system, and its performance (including power/area/noise coefficient and linearity) enhancement and potential discovery have become ongoing and challenging research hot topics.

In mobile communication, in order to extend the standby time, the reduction of the power consumption of the receiver has always been a hot topic of research. A traditional receiver includes a low noise amplifier (LNA)/mixer (Mixer)/Quadrature LO generator circuit and an analog baseband section. In the RF receiver of such a structure, the power consumption of the LNA/Mixer and the Quadrature LO generator usually accounts for more than 50% of the power consumption of the receiver. Many methods to generate the orthogonal signal have been developed. One is to use RC-CR phase shifter which produce two signals with phase difference of 90 degrees using resister and capacitance for phase shift, but the in-phase/quadrature (IQ) signal generated by this way has a large mismatch and the application thereof is rare. The other is to use orthogonal voltage controlled oscillator (VCO) directly without the need to create an orthogonal circuit, however, the IQ signal mismatch is also large, two inductors are required, and the chip area is large.

SUMMARY

It is an object of the present application is to provide a radio frequency receiving circuit which adopts a multiplexed source coupled logic (SCL) divide-by-2 divider to realize the amplification and mixing of the radio frequency signal, thereby solving the problems of high power consumption and large chip area in the conventional radio frequency receiving circuit.

In accordance with one embodiment of the present application, there is provided a radio frequency receiving circuit, and the radio frequency receiving circuit comprises:

a tail current source, configure to be multiplexed to input radio frequency signals and amplify the radio frequency signals for producing a radio frequency current;

a clock signal input unit, in connection with the tail current source and configured to input clock signals;

a sampling-and-holding unit, in connection with the clock signal input unit and configured to output an orthogonal signal having a frequency of one half of a clock frequency; and a load unit, in connection with the sampling-and-holding unit, wherein the radio frequency current flowing through the load unit is converted into a voltage which is modulated by the orthogonal signal, and a medium frequency signal having a frequency equivalent to a difference between a radio frequency signal frequency and an orthogonal signal frequency is output, whereby achieving frequency mixing.

In a class of this embodiment, the tail current source comprises a first MOS and a second MOS, a source of the first MOS is grounded, a drain of the first MOS is in connection with the clock signal input unit, a source of the second MOS is grounded, a drain of the second MOS is in connection with the clock signal input unit, a grid of the first MOS and a grid of the second MOS serve as a first input terminal and a second input terminal of the tail current source, respectively, and the first input terminal and the second input terminal are configured to input radio frequency signals.

In a class of this embodiment, the tail current source further comprises a first inductance and a second inductance, the first inductance is in connection between the source of the first MOS and the ground, and the second inductance is in connection between the source of the second MOS M2 and the ground.

In a class of this embodiment, the clock signal input unit comprises: a third MOS, a fourth MOS, a fifth MOS, and a sixth MOS. A source of the third MOS and a source of the fourth MOS are commonly connected to the tail current source, a drain of the third MOS is in connection with the sampling-and-holding unit, a drain of the fourth MOS is in connection with the sampling-and-holding unit, a source of the fifth MOS and a source of the sixth MOS are commonly connected to the tail current source, a drain of the fifth MOS is in connection with the sampling-and-holding unit, and a drain of the sixth MOS is in connection with the sampling-and-holding unit, a grid of the third MOS and a grid of the sixth MOS are commonly connected to act as a first input terminal of the clock signal input unit, a grid of the fourth MOS and a grid of the fifth MOS are commonly connected to act as a second input terminal of the clock signal input unit, and the first terminal and the second terminal are configured to input the clock signals.

In a class of this embodiment, the sampling-and-holding unit comprises: a seventh MOS, an eighth MOS, a ninth MOS, a tenth MOS, an eleventh MOS, a twelfth MOS, a thirteenth MOS, and a fourteenth MOS. The seventh MOS and the eighth MOS form a first sampling module, the eleventh MOS and the twelfth MOS form a second sampling module, the ninth MOS and the tenth MOS form a first holding module, the thirteenth MOS and the fourteenth MOS form a second holding module. A source of the seventh MOS, a source of the eighth MOS, a source of the ninth MOS, a source of the tenth MOS, a source of the eleventh MOS, a source of the twelfth MOS, a source of the thirteenth MOS, and a source of the fourteenth MOS are all in connection with the clock signal input unit. A drain of the seventh MOS, a drain of the eighth MOS, a drain of the ninth MOS, a drain of the tenth MOS, a drain of the eleventh MOS, a drain of the twelfth MOS, a drain of the thirteenth MOS, a drain of the fourteenth MOS, a grid of the seventh MOS, a grid of the eighth MOS, a grid of the ninth MOS, a grid of the tenth MOS, a grid of the eleventh MOS, a grid of the twelfth MOS, a grid of the thirteenth MOS, a grid of the fourteenth MOS are all in connection with the load unit. Common connections of the drain of the seventh MOS, the drain of the tenth MOS, the grid of the ninth MOS, the grid of the twelfth MOS with the load unit serve as a first output port of the sampling-and-holding unit. Common connections of the drain of the eighth MOS, the drain of the ninth MOS, the grid of the tenth MOS, and the grid of the eleventh MOS with the load unit serve as a second output port of the sampling-and-holding unit. Common connections of the drain of the eleventh MOS, the drain of the fourteenth MOS, the grid of the seventh MOS, and the grid of the thirteenth MOS with the load unit serve as a third output port of the sampling-and-holding unit. Common connections of the drain of the twelfth MOS, the drain of the thirteenth MOS, the grid of the eighth MOS, and the grid of the fourteenth MOS with the load unit serve as a fourth output port of the sampling-and-holding unit.

In a class of this embodiment, each of the output signal of each of the first output port of the sampling-and-holding unit, the second output port of the sampling-and-holding unit, a third output port of the sampling-and-holding unit, and a fourth output port of the sampling-and-holding unit has a frequency equivalent to a difference between the radio frequency signal frequency and the orthogonal signal frequency.

In a class of this embodiment, the load unit comprises four load modules, and each of said load modules has one end in connection with a direct current power supply and the other end in connection with the sampling-and-holding unit.

In a class of this embodiment, each of said load modules comprises: a first resistor, a second resistor, and a first capacitor. The first resistor is in connection between the sampling-and-holding unit and the direct current power supply. A serial connection of the second resistor with the first capacitor is in parallel connection with the first resistor.

In accordance with another embodiment of the present application, there is provided a the radio frequency receiver, the radio frequency receiver comprises the above-described radio frequency receiving circuit.

In the radio frequency receiving circuit according to embodiments of the present application, the input radio frequency signal is amplified by the tail current source, and the frequency mixing is performed by the sampling-and-holding unit and the load unit. Not only is the traditional function of generation of the orthogonal signal realized, but also the input radio frequency signal can be amplified and mixed, such that the multiplexing of the divide-by-2 circuit is realized, the power consumption of the circuit is lowered, and the power consumption and the area of the chip are saved, thereby being beneficial for maintaining the orthogonality of the orthogonal signal.

DETAILED DESCRIPTION OF THE EMBODIMENTS

To make the purpose, the technical solution, and the advantageous of the present application more clear and understandable, the present application will be further described in detail below with reference to the accompanying drawings and embodiments. It is understood that the specific embodiments described herein are merely illustrative of the present application and are not intended to limit the present application.

Figure 1:
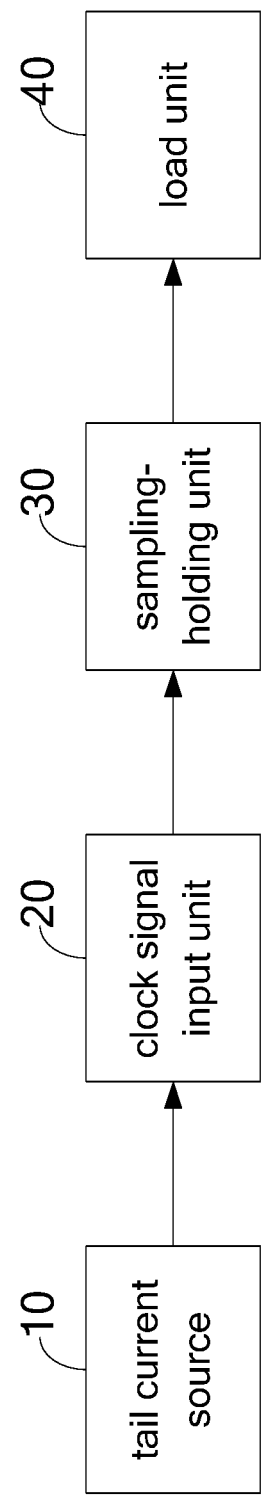
FIG. 1 is a structural diagram of a radio frequency receiving circuit provided by one embodiment of the present application.

FIG. 1 illustrates a structural diagram of a radio frequency receiving circuit provided by one preferred embodiment of the present application. For facilitating the description, only those related to the present embodiment are shown, and described as follows:

A radio frequency receiving circuit is provided, and the radio frequency receiving circuit comprises: a tail current source 10, a clock signal input unit 20, a sampling-and-holding unit 30, and a load unit 40. Not only is the traditional function of generation of the orthogonal signal realized, but also the input radio frequency signal can be amplified and mixed, such that the multiplexing of the divide-by-2 circuit is realized, the power consumption of the circuit is lowered, and the power consumption and the area of the chip are saved, thereby being beneficial for maintaining the orthogonality of the orthogonal signal.

Figure 2:
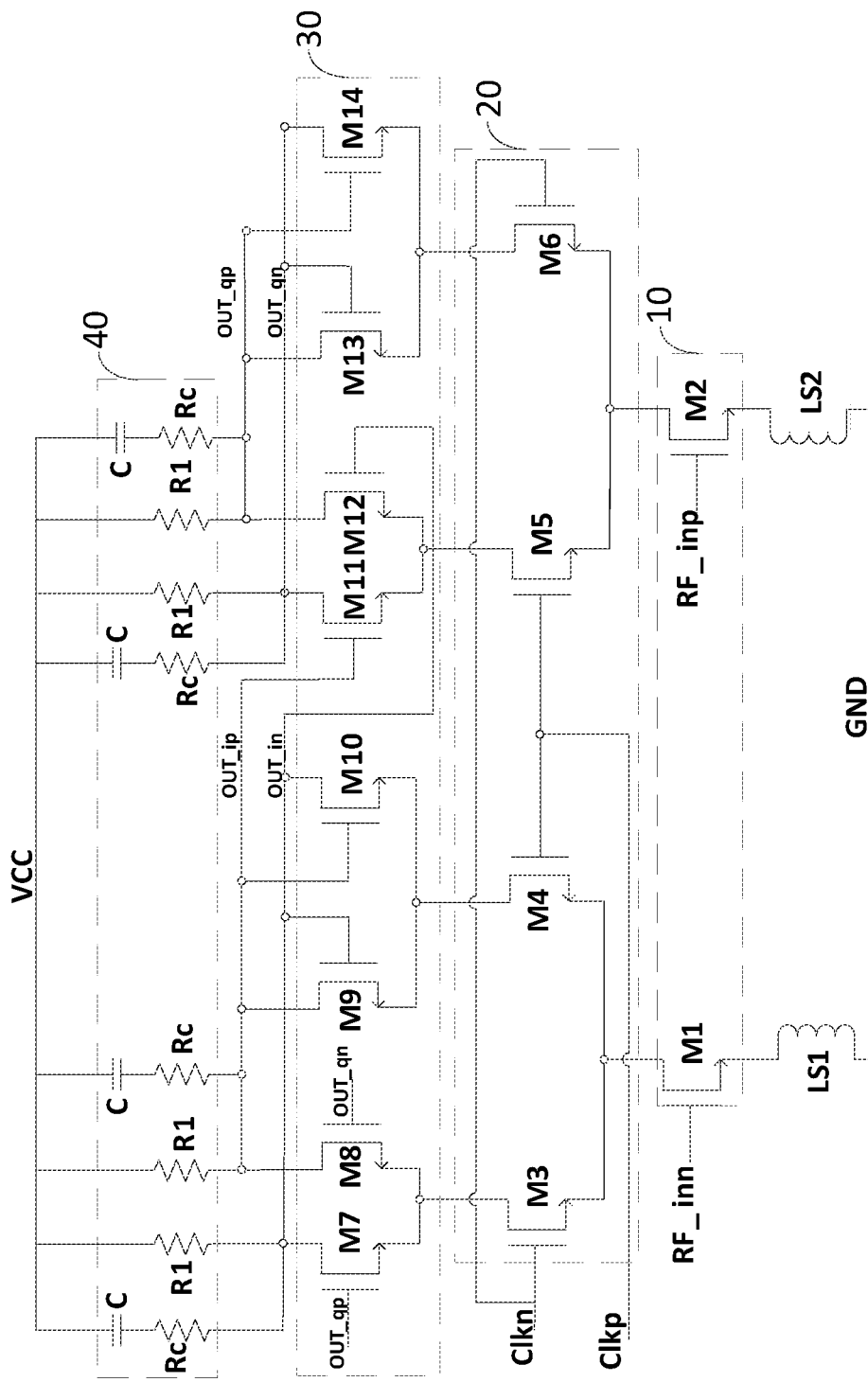
FIG. 2 is an exemplary circuit schematic diagram of the radio frequency receiving circuit provided by one embodiment of the present application.

As shown in FIG. 2, the tail current source 10 is configured to input radio frequency signals and amplifying the radio frequency signals. Specifically, the tail current source 10 comprises a first MOS M1 and a second MOS M2, a source of the first MOS M1 is grounded, a drain of the first MOS M1 is in connection with the clock signal input unit 20, a source of the second MOS M2 is grounded, a drain of the second MOS M2 is in connection with the clock signal input unit 20, a grid of the first MOS M1 and a grid of the second MOS M2 serve as a first input terminal and a second input terminal of the tail current source 10, respectively, and the first input terminal and the second input terminal are configured to input differential radio frequency signals RF_inn and RF_inp. The first MOS M1 and the second MOS M2 convert the input radio frequency voltages into current signals, and at the same time amplify the current signals. The tail current source 10 further comprises a first inductance LS1 and a second inductance LS2, the first inductance LS1 is in connection between the source of the first MOS M1 and the ground, and the second inductance LS2 is in connection between the source of the second MOS M2 and the ground. In practical application, in order to realize the input match of the radio frequency signal and maintain the compromise between the noise and the power consumption, inductance values of the first inductance LS1 and the second inductance LS2 can be regulated for optimization. The first inductance LS1 and the second inductance LS2 can be integrated on a chip, or alternatively, bound inductances may be used.

The clock signal input unit 20 is in connection with the tail current source 10 for inputting clock signals. The clock signal input unit 20 comprises: a third MOS M3, a fourth MOS M4, a fifth MOS M5, and a sixth MOS M6. A source of the third MOS M3 and a source of the fourth MOS M4 are commonly connected to the tail current source 10, a drain of the third MOS M3 is in connection with a sampling unit, a drain of the fourth MOS M4 is in connection with a holding unit, a source of the fifth MOS M5 and a source of the sixth MOS M6 are commonly connected to the tail current source 10, a drain of the fifth MOS M5 is in connection with a sampling unit, and a drain of the sixth MOS M6 is in connection with a holding unit, a grid of the third MOS M3 and a grid of the sixth MOS M6 are commonly connected to act as a first input terminal of the clock signal input unit 20, a grid of the fourth MOS M4 and a grid of the fifth MOS M5 are commonly connected to act as a second input terminal of the clock signal input unit 20, and the first terminal and the second terminal are configured to input the clock signals Clkn and Clkp, where both Clkn and Clkp are clock signals having the same amplitude and opposite phases.

The sampling-and-holding unit 30 is in connection with the clock signal input unit 20 and outputs an orthogonal signal having a frequency being one half of the clock frequency, the radio frequency current flowing through the load unit 40 is converted into a voltage and modulated by the orthogonal signal, a medium frequency signal having a frequency equivalent to a difference between the radio frequency signal frequency and the orthogonal signal frequency is output, thereby realizing the frequency mixing. The sampling-and-holding unit 30 comprises: a seventh MOS M7, an eighth MOS M8, a ninth MOS M9, a tenth MOS M10, an eleventh MOS M11, a twelfth MOS M12, a thirteenth MOS M13, and a fourteenth MOS M14. The seventh MOS M7 and the eighth MOS M8 form a first sampling module, the eleventh MOS M11 and the twelfth MOS M12 form a second sampling module, the ninth MOS M9 and the tenth MOS M10 form a first holding module, and the thirteenth MOS M13 and the fourteenth MOS M14 form a second holding module. A source of the seventh MOS M7, a source of the eighth MOS M8, a source of the ninth MOS M9, a source of the tenth MOS M10, a source of the eleventh MOS M11, a source of the twelfth MOS M12, a source of the thirteenth MOS M13, and a source of the fourteenth MOS M14 are all in connection with the clock signal input unit 20. A drain of the seventh MOS M7, a drain of the eighth MOS M8, a drain of the ninth MOS M9, a drain of the tenth MOS M10, a drain of the eleventh MOS M11, a drain of the twelfth MOS M12, a drain of the thirteenth MOS M13, a drain of the fourteenth MOS M14, a grid of the seventh MOS M7, a grid of the eighth MOS M8, a grid of the ninth MOS M9, a grid of the tenth MOS M10, a grid of the eleventh MOS M11, a grid of the twelfth MOS M12, a grid of the thirteenth MOS M13, a grid of the fourteenth MOS M14 are all in connection with the load unit 40. Common connections of the drain of the seventh MOS M7, the drain of the tenth MOS M10, the grid of the ninth MOS M9, the grid of the twelfth MOS M12 with the load unit 40 serve as a first output port OUT_in of the sampling-and-holding unit 30; common connections of the drain of the eighth MOS M8, the drain of the ninth MOS M9, the grid of the tenth MOS M10, and the grid of the eleventh MOS M11 with the load unit 40 serve as a second output port OUT_ip of the sampling-and-holding unit 30; common connections of the drain of the eleventh MOS M11, the drain of the fourteenth MOS M14, the grid of the seventh MOS M7, and the grid of the thirteenth MOS M13 with the load unit 40 serve as a third output port OUT_qn of the sampling-and-holding unit 30; and common connections of the drain of the twelfth MOS M12, the drain of the thirteenth MOS M13, the grid of the eighth MOS M8, and the grid of the fourteenth MOS M13 with the load unit 40 serve as a fourth output port OUT_qp of the sampling-and-holding unit 30. The output signal of each of the first output port OUT_in of the sampling-and-holding unit, the second output port OUT_ip of the sampling-and-holding unit, a third output port OUT_qn of the sampling-and-holding unit, and a fourth output port OUT_qp of the sampling-and-holding unit has a frequency equivalent to a difference between the radio frequency signal frequency and the orthogonal signal frequency.

The load unit 40 is in connection with the sampling-and-holding unit 30, the load unit 40 comprises four identical load modules. Each of the load modules is in connection between a direct current power supply and the sampling-and-holding unit 30. Each load module comprises: a first resistor R1, a second resistor Rc, and a first capacitor C; the first resistor R1 is in connection between the sampling-and-holding unit 30 and the direct current power supply, and a serial connection of the second resistor Rc with the first capacitor C is in parallel connection with the first resistor R1. The load module is a highpass network, at low frequency, an impedance of the load module approaches a resistance of the first resistor R1, and at high frequency, the impedance of the load module is an impedance of a parallel connection of the first resistor R1 and a first capacitor C, such that the high resistance at low frequency and the low resistance at high frequency are realized, which is beneficial for improving the gain of the output of the medium frequency, and meanwhile ensures the latching performance of the SCL so as to realize the correct divide-by-2 frequency division.

The sampling-and-holding unit 30 and the load unit 40 are used to perform the divide-by-2 frequency division on the clock signal, and meanwhile used to perform the frequency mixing on the input radio frequency signals and output the medium frequency signal.

On the basis of the radio frequency receiving circuit, the present embodiments of the application also provides a radio frequency receiver, and the radio frequency receiver comprises the above-described radio frequency receiving circuit.

The radio frequency receiving circuit provided by the present embodiment of the application is explained by the principle thereof hereinbelow:

The output current of first MOS M1 and the second MOS M2 in the tail current source 10 is:

$$i_s = \frac{1}{2} g_m v_{RF} \cos \omega_{RF} t \qquad (1)$$

$g_m$ represents a transconductance between the first MOS M1 and the second MOS M2, $g_m=g_{m_1}=g_{m_2}$, $v_{RF}$ and $\omega_{RF}$ represent an input voltage and an angular frequency of the radio frequency signal respectively. Considering that the third MOS M3 and the fourth MOS M4 (or the fifth MOS M5 and the sixth MOS M6) input with the differential radio frequency signals are switched on at different time points, IQ is a differential orthogonal signal having a duty of approximately 25%, the seventh MOS M7-the fourteenth MOS M14 are not switched on at the same time point, therefore, the current flowing through each of the seventh MOS M7-the fourteenth MOS M14 is approximately $i_S$, and the current flowing through the load unit 40 is:

$$i_{IF} = \text{sgn}[\cos \omega_{LO} t] i_S \qquad (2)$$

Herein, the sgn [cos $\omega_{LO}$ t] is a square wave signal having an amplitude of 1 and a frequency of $\omega_{LO}$, therefore the square wave signal is performed with the Fourier Transform to yield:

$$\text{sgn}[\cos \omega_{LO} t] = \sum_{k=1}^{\infty} A_k \cos k \omega_{LO} t A_k = \frac{\sin\left(\frac{k\pi}{2}\right)}{k\pi/4} \qquad (3)$$

Finally, the current flowing through the load unit is:

$$i_s = g_m v_{RF} \sum_{k=1}^{\infty} \frac{\sin^{k\pi/2}}{k\pi/2} [\cos(k\omega_{LO} + \omega_{RF})t + \cos(k\omega_{LO} - \omega_{RF})t] \quad (4)$$

It is known from the formula that when the clock signal is strong enough, the voltage gain of the medium frequency output port:

$$G_v = g_m \frac{2}{\pi} R_1 \quad (5)$$

It is known that the mixer circuit of such structure has the same voltage gain as the conventional Gilbert double-balanced mixer, thereby not resulting in any additional consumption.

The above-described embodiments are only preferred embodiments of the present application, and are not intended to limit the present application. Any modifications, equivalents, and improvements made within the spirit and scope of the present application should be included in the scope of the present invention.

What is claimed is:

1. A radio frequency receiving circuit, comprising:
   a tail current source, configure to be multiplexed to input radio frequency signals and amplify the radio frequency signals for producing a radio frequency current;
   a clock signal input unit, in connection with the tail current source and configured to input clock signals;
   a sampling-and-holding unit, in connection with the clock signal input unit and configured to output an orthogonal signal having a frequency of one half of a clock frequency; and
   a load unit, in connection with the sampling-and-holding unit, wherein the radio frequency current flowing through the load unit is converted into a voltage which is modulated by the orthogonal signal, and a medium frequency signal having a frequency equivalent to a difference between a radio frequency signal frequency and an orthogonal signal frequency is output.

2. The radio frequency receiving circuit of claim 1, wherein the tail current source comprises a first MOS and a second MOS, a source of the first MOS is grounded, a drain of the first MOS is in connection with the clock signal input unit, a source of the second MOS is grounded, a drain of the second MOS is in connection with the clock signal input unit, a grid of the first MOS and a grid of the second MOS serve as a first input terminal and a second input terminal of the tail current source, respectively, and the first input terminal and the second input terminal are configured to input radio frequency signals.

3. The radio frequency receiving circuit of claim 1, wherein the tail current source further comprises a first inductance and a second inductance, the first inductance is in connection between the source of the first MOS and the ground, and the second inductance is in connection between the source of the second MOS M2 and the ground.

4. The radio frequency receiving circuit of claim 1, wherein
   the clock signal input unit comprises: a third MOS, a fourth MOS, a fifth MOS, and a sixth MOS; and
   a source of the third MOS and a source of the fourth MOS are commonly connected to the tail current source, a drain of the third MOS is in connection with the sampling-and-holding unit, a drain of the fourth MOS is in connection with the sampling-and-holding unit, a source of the fifth MOS and a source of the sixth MOS are commonly connected to the tail current source, a drain of the fifth MOS is in connection with the sampling-and-holding unit, and a drain of the sixth MOS is in connection with the sampling-and-holding unit, a grid of the third MOS and a grid of the sixth MOS are commonly connected to act as a first input terminal of the clock signal input unit, a grid of the fourth MOS and a grid of the fifth MOS are commonly connected to act as a second input terminal of the clock signal input unit, and the first terminal and the second terminal are configured to input the clock signals.

5. The radio frequency receiving circuit of claim 1, wherein
   the sampling-and-holding unit comprises: a seventh MOS, an eighth MOS, a ninth MOS, a tenth MOS, an eleventh MOS, a twelfth MOS, a thirteenth MOS, and a fourteenth MOS;
   the seventh MOS and the eighth MOS form a first sampling module, the eleventh MOS and the twelfth MOS form a second sampling module, the ninth MOS and the tenth MOS form a first holding module, the thirteenth MOS and the fourteenth MOS form a second holding module;
   a source of the seventh MOS, a source of the eighth MOS, a source of the ninth MOS, a source of the tenth MOS, a source of the eleventh MOS, a source of the twelfth MOS, a source of the thirteenth MOS, and a source of the fourteenth MOS are all in connection with the clock signal input unit;
   a drain of the seventh MOS, a drain of the eighth MOS, a drain of the ninth MOS, a drain of the tenth MOS, a drain of the eleventh MOS, a drain of the twelfth MOS, a drain of the thirteenth MOS, a drain of the fourteenth MOS, a grid of the seventh MOS, a grid of the eighth MOS, a grid of the ninth MOS, a grid of the tenth MOS, a grid of the eleventh MOS, a grid of the twelfth MOS, a grid of the thirteenth MOS, a grid of the fourteenth MOS are all in connection with the load unit;
   common connections of the drain of the seventh MOS, the drain of the tenth MOS, the grid of the ninth MOS, the grid of the twelfth MOS with the load unit serve as a first output port of the sampling-and-holding unit;
   common connections of the drain of the eighth MOS, the drain of the ninth MOS, the grid of the tenth MOS, and the grid of the eleventh MOS with the load unit serve as a second output port of the sampling-and-holding unit;
   common connections of the drain of the eleventh MOS, the drain of the fourteenth MOS, the grid of the seventh MOS, and the grid of the thirteenth MOS with the load unit serve as a third output port of the sampling-and-holding unit; and
   common connections of the drain of the twelfth MOS, the drain of the thirteenth MOS, the grid of the eighth MOS, and the grid of the fourteenth MOS with the load unit serve as a fourth output port of the sampling-and-holding unit.

6. The radio frequency receiving unit of claim 5, wherein each of the output signal of each of the first output port of the sampling-and-holding unit, the second output port of the sampling-and-holding unit, a third output port of the sampling-and-holding unit, and a fourth output port of the sampling-and-holding unit has a frequency equivalent to a difference between the radio frequency signal frequency and the orthogonal signal frequency.

7. The radio frequency receiving circuit of claim 1, wherein the load unit comprises four load modules, and each of said load modules has one end in connection with a direct current power supply and the other end in connection with the sampling-and-holding unit.

8. The radio frequency receiving circuit of claim 7, wherein each of said load modules comprises: a first resistor, a second resistor, and a first capacitor;

the first resistor is in connection between the sampling-and-holding unit and the direct current power supply; and a serial connection of the second resistor with the first capacitor is in parallel connection with the first resistor.

9. A radio frequency receiver comprising the radio frequency receiving circuit of claim 1.

* * * * *